US007567439B2

(12) United States Patent
Li et al.

(10) Patent No.: US 7,567,439 B2
(45) Date of Patent: Jul. 28, 2009

(54) HEAT DISSIPATION DEVICE HAVING A ROTATABLE FASTENER

(75) Inventors: Wu Li, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 63 days.

(21) Appl. No.: 11/837,460

(22) Filed: Aug. 10, 2007

(65) Prior Publication Data

US 2009/0040730 A1 Feb. 12, 2009

(51) Int. Cl.
*H05K 7/20* (2006.01)

(52) U.S. Cl. ....................... 361/710; 361/704; 361/717; 361/719; 165/80.3; 165/104.33; 165/185

(58) Field of Classification Search ................. 361/684, 361/687–689, 690–697, 702–714, 719–726, 361/732, 737, 740–742, 747, 752–756, 757–759, 361/800–807, 816, 818; 165/80.3, 80.4, 165/80.5, 104.33, 185; 174/15.1, 16.3, 252; 257/706–727; 24/453, 457, 458, 473, 527, 24/625; 411/508–511, 518, 521, 913; 29/739–741, 29/743, 832, 840

See application file for complete search history.

(56) References Cited

U.S. PATENT DOCUMENTS 6,280,222 B1 * 8/2001 Walkup ..................... 439/331
6,501,657 B1 * 12/2002 Carr ........................... 361/704
6,634,095 B2 * 10/2003 Colbert et al. ................ 29/740
6,707,674 B1 * 3/2004 Bryant et al. ............... 361/704
7,009,844 B2 * 3/2006 Farrow et al. .............. 361/704
7,142,430 B2 * 11/2006 Lee et al. .................... 361/719
7,224,587 B2 * 5/2007 Dittus et al. ................ 361/719
7,286,363 B2 * 10/2007 Lee et al. .................... 361/709
2005/0281001 A1 12/2005 Dittus et al.
2008/0174968 A1 * 7/2008 Feng et al. .................. 361/720

* cited by examiner

*Primary Examiner*—Michael V Datskovskiy
(74) *Attorney, Agent, or Firm*—Frank R. Niranjan

(57) ABSTRACT

A heat dissipation device includes a heat sink, a retention module and a rotatable fastener for securing the heat sink to the retention module. The retention module includes two supporting ribs and a positioning block above one of the supporting ribs. The rotatable fastener is rotatably received in the retention module and includes an actuating portion and a pressing portion fastened to the actuating portion. The heat sink rests on the supporting ribs of the retention module with an end thereof being pressed by the positioning block, and an opposite end thereof being pressed by the pressing portion. The rotatable fastener can be rotated to an unlocked position wherein the pressing portion is moved away from the opposite end of the heat sink, so that the heat sink is removable from the retention module.

10 Claims, 6 Drawing Sheets

10 14 120 122 12 340 34 342 360 36 30 362 324 32 322 320 250 25 28 26 20 24 220 232 230 23

HEAT DISSIPATION DEVICE HAVING A ROTATABLE FASTENER

BACKGROUND OF THE INVENTION

1. Field of the Invention

The present invention relates generally to heat dissipation devices, and more particularly to a heat dissipation device having a rotatable fastener for securing a heat sink to a heat-generating component such as a central processing unit (CPU) mounted on a printed circuit board.

2. Description of Related Art

It is widely acknowledged that heat is produced during operations of electronic devices such as central processing units (CPUs). The produced heat must be quickly removed to ensure the CPUs working normally. Typically, a heat sink is disposed on the CPU to dissipate the heat therefrom.

In earlier times, linear-type locking devices were widely used for securing of heat sinks. A linear-type locking device, which is integrally made from a resilient metal wire, generally includes an elongated central pressing portion and a pair of locking arms extending from opposite ends of the elongated central pressing portion in opposite directions to thereby form a Z-shaped configuration. When assembled, the elongated central pressing portion of the linear-type locking device lodges in a heat sink, and the locking arms thereof are then resiliently deflected downwardly to engage with positioning means provided on a frame or socket to thereby secure the heat sink to a CPU. An example of a linear-type locking device is shown in U.S. Pat. No. 5,386,338. However, a linear-type locking device generally has a slim structure; it cannot firmly secure a heat sink to a CPU, especially nowadays the heat sink being made bigger and heavier aiming to obtain a high heat dissipating capacity. The linear-type locking device cannot securely fasten such a large and heavy heat sink to the CPU when the heat sink is subject to a vibration.

Thus, an improved locking device which overcomes above-mentioned problems is required.

SUMMARY OF THE INVENTION

A heat dissipation device in accordance with a preferred embodiment of the present invention includes a heat sink, a retention module and a rotatable fastener for firmly positioning the heat sink in the retention module. The heat sink includes a base for contacting with a heat-generating component. The retention module includes a bottom wall and a positioning block formed at one side thereof. The rotatable fastener is rotatably connected to the retention module and includes a pressing portion for pressing the base of the heat sink towards the bottom wall of the retention module. The heat sink rests on the bottom wall of the retention module with an end thereof being pressed by the positioning block, and an opposite end thereof being pressed by the pressing portion when the rotatable fastener is rotated in the retention module to a locked position. The rotatable fastener can be at an unlocked position where the rotatable fastener is rotated relative to the retention module to a position wherein the pressing portion is moved away from the opposite end of the heat sink and located between two pivot tabs of the retention module. At the unlocked position, the heat sink is removable from the retention module. A spring is attached to a bottom face of the pressing portion. The spring resiliently and downwardly presses the opposite end of the heat sink when the rotatable fastener is rotated to the locked position.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
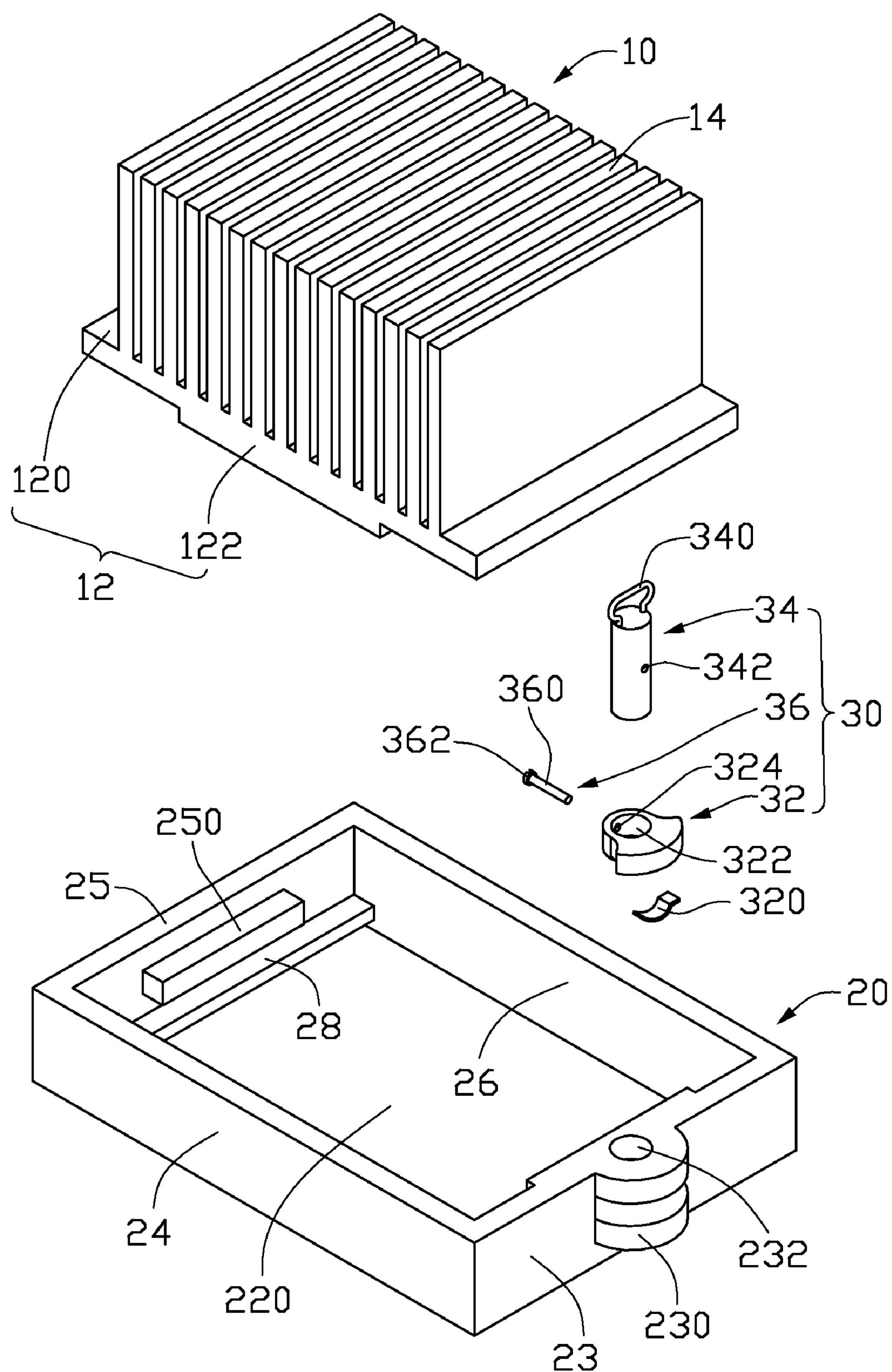
FIG. 1 is an exploded, isometric view of a heat dissipation device according to a preferred embodiment of the present invention.
Figure 2:
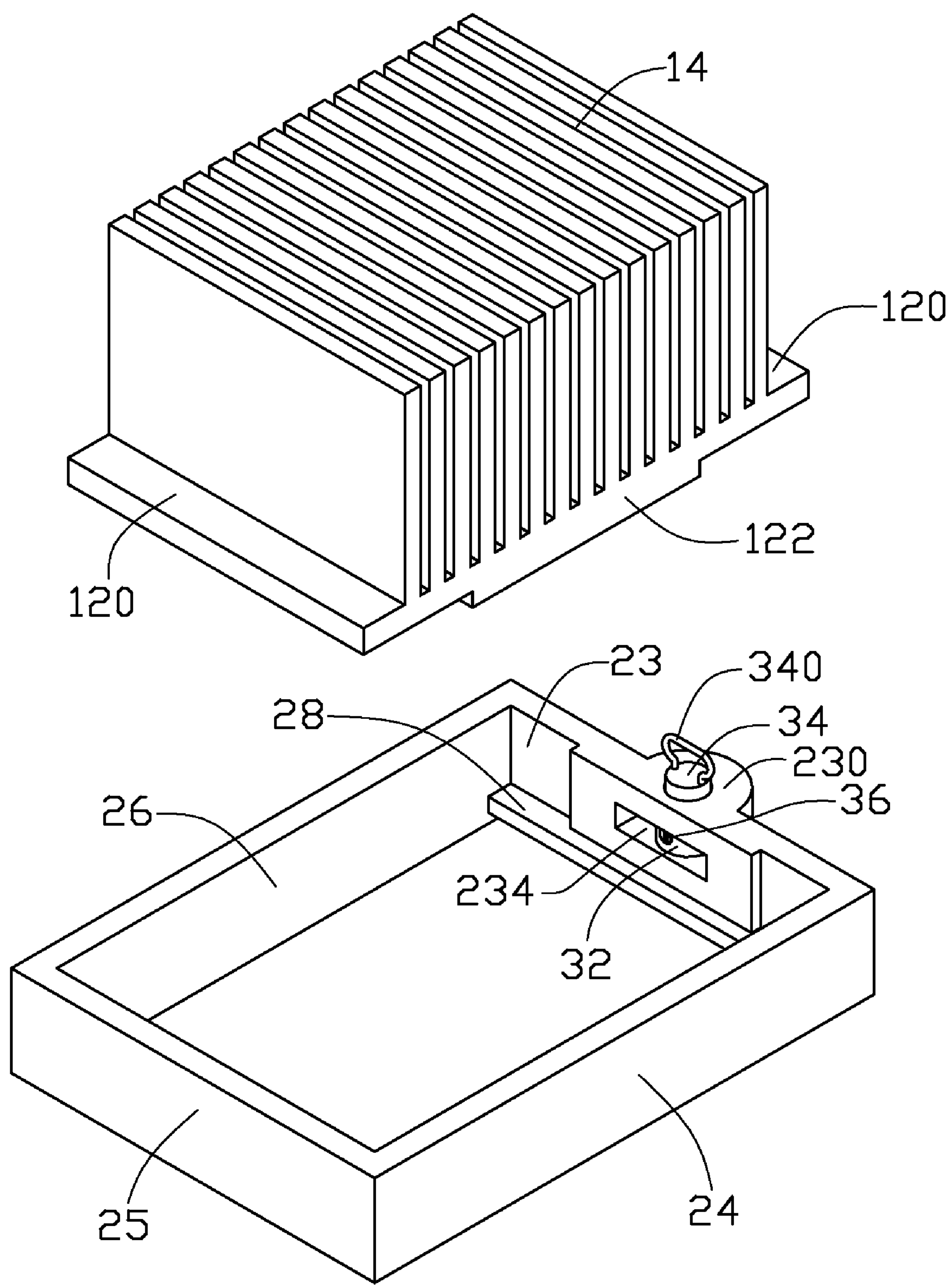
FIG. 2 is a view similar to FIG. 1, but from a different aspect and with a rotatable fastener assembled to a retention module of the heat dissipation device of FIG. 1.

FIG. 1 illustrates a heat dissipation device in accordance with a preferred embodiment of the present invention, which comprises a heat sink 10, a retention module 20 and a rotatable fastener 30 for securing the heat sink 10 to a heat-generating component such as a CPU (not shown).

The heat sink 10 comprises a base 12 and a plurality of heat-dissipating fins 14 integrally formed from a top surface (not labeled) of the base 12. The heat-dissipating fins 14 extend vertically and upwardly from the top surface of the base 12. The heat-dissipating fins 14 may be in any configuration known in the art, providing that they can effectively dissipate the heat produced by the CPU. The base 12 has two border portions 120 at two opposite sides thereof respectively. There is no fin on the border portions 120 when the fins 14 are formed on the base 12. A protruding portion 122 extends downwards from a center of a bottom surface (not labeled) of the base 12, for contacting the CPU.

The retention module 20 is a substantially rectangular frame, which is located around the CPU, and has a first sidewall 23, a second sidewall 24, a third sidewall 25 and a fourth sidewall 26 cooperatively forming a circumference of the retention module 20, with an opening 220 in a center thereof for receiving the CPU. The first and second sidewalls 23, 24 are arranged opposite to the third and fourth sidewalls 25, 26, respectively. The first and third sidewalls 23, 25 each have a length shorter than that of each of the second and fourth sidewalls 24, 26. A pair of supporting ribs 28 are located at inner surfaces of the first and third sidewalls 23, 25 respectively and at a location adjacent to a bottom side of the retention module 20. The first sidewall 23 forms two adjacent and horizontal pivot tabs 230 at a middle portion thereof, for receiving the rotatable fastener 30 therein. The pivot tabs 230 extend outwardly and horizontally from an outer surface of the first sidewall 23 and each have an arc-shaped configuration. Each pivot tab 230 defines a pivot hole 232 in a center thereof for receiving the rotatable fastener 30 in the retention module 20. An elongate mouth 234 is defined in a projecting portion at an inner surface of the first sidewall 23. The elongate mouth 234 is defined above the supporting rib 28 of the first sidewall 23 and between the two pivot tabs 230, for a pressing portion 32 of the rotatable fastener 30 to extend therethrough when the rotatable fastener 30 is rotated to a locked position. A positioning block 250 is horizontally located at an inner surface of the third sidewall 25 and above the supporting rib 28 of the third sidewall 25, for pressing downwards a corresponding border portion 120 of the base 12 of the heat sink 10.

The rotatable fastener 30 is rotatably assembled to the retention module 20 and used to press the base 12 of the heat sink 10 towards the retention module 20 and the CPU. The rotatable fastener 30 comprises the pressing portion 32, an actuating portion 34 vertically extending through the pressing portion 32 and a bolt 36 horizontally extending in the pressing portion 32 and the actuating portion 34 to fasten the pressing portion 32 to the actuating portion 34. The pressing portion 32 generally has a fan-like shape and has a spring 320 mounted on a bottom surface of the pressing portion 32, for tightly pressing corresponding one of the border portions 120 of the heat sink 10 towards the supporting tab 28 of the first sidewall 23 of the retention module 20. A retaining hole 322 is defined in a center of a circular base (not labeled) of the pressing portion 32, for receiving a middle part of the actuating portion 34 therein. A bore 324 is laterally defined in a wall of the base of the pressing portion 32, for the bolt 36 to extend therethrough to enter the retaining hole 322. The actuating portion 34 has a round column-like body (not labeled) and a handle 340 formed at an upper end thereof. A through hole 342 is transversely defined in a middle portion of the body of the actuating portion 34, for the bolt 36 to extend therein. The bolt 36 has a body 360 and a head 362 located at one end of the body 360. The body 360 is used to insert in the bore 324 of the pressing portion 32 and the through hole 342 of the actuating portion 34 until the head 362 abuts against the actuating portion 34, whereby the actuating portion 34 and the pressing portion 32 are securely connected together.

In assembly of the rotatable fastener 30 to the retention module 20, firstly the pressing portion 32 is placed between the two pivot tabs 230 with the retaining hole 322 of the pressing portion 32 in line with the pivot holes 232 of the two pivot tabs 230. The actuating portion 34 is then brought to extend downwardly through the retaining hole 322 of the pressing portion 32 and the pivot holes 232 of the two pivot tabs 230, until the through hole 342 of the actuating portion 34 faces the mouth 234 of the first sidewall 23 of the retention module 20. Then, the bolt 36 is brought to extend through the mouth 234 of the first sidewall 23, the bore 324 of the pressing portion 32 and the through holes 342 of the actuating portion 34 and is inserted in the pressing portion 32 and the actuating portion 34 with the head 362 of the bolt 36 tightly abutting against the pressing portion 32, whereby the actuating portion 34 and the pressing portion 32 are fastened together in the retention module 20 by the bolt 36. The pressing portion 32 is rotatably located between the two pivot tabs 230 of the retention module 20. The actuating portion 34 is received in the pivot holes 232 of the two pivot tabs 230. A rotation of the actuation portion 34 by manipulating the handle 340 causes the pressing portion 32 to rotate accordingly.

Figure 3:
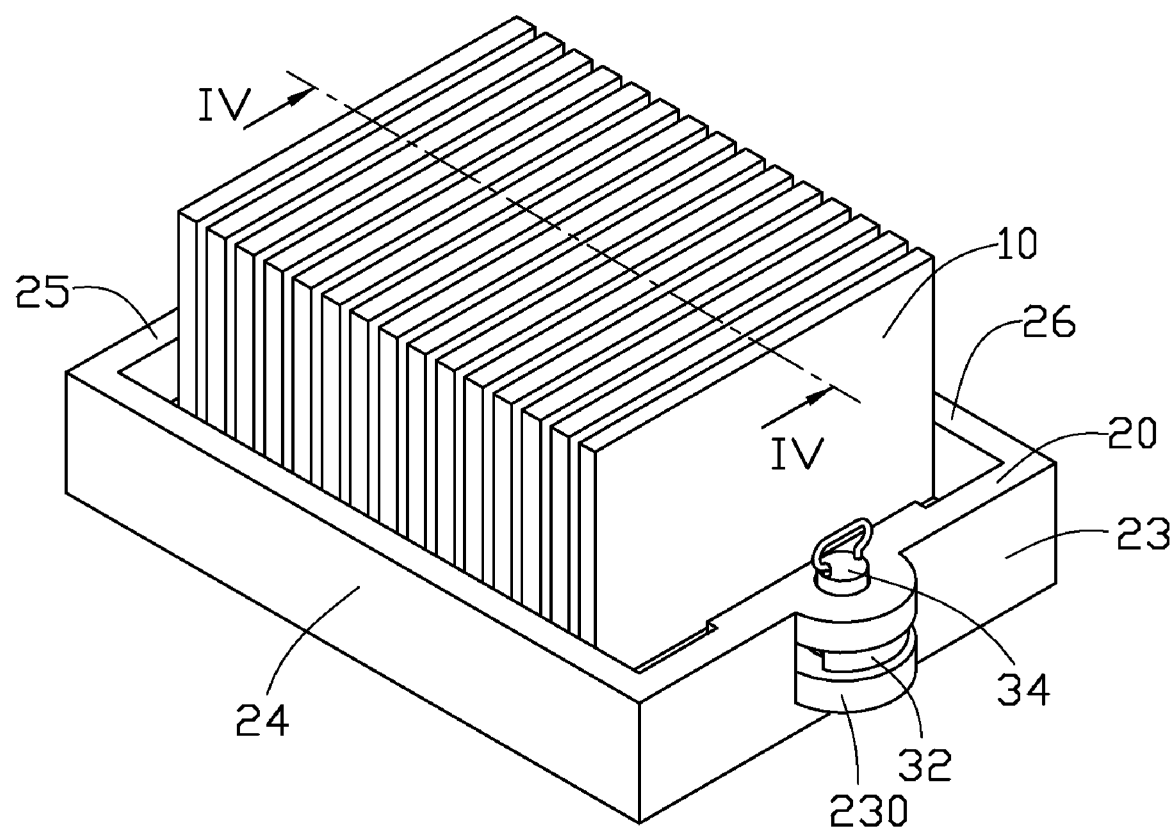
FIG. 3 is an assembled view of FIG. 1 with the rotatable fastener at an unlocked position.
Figure 4:
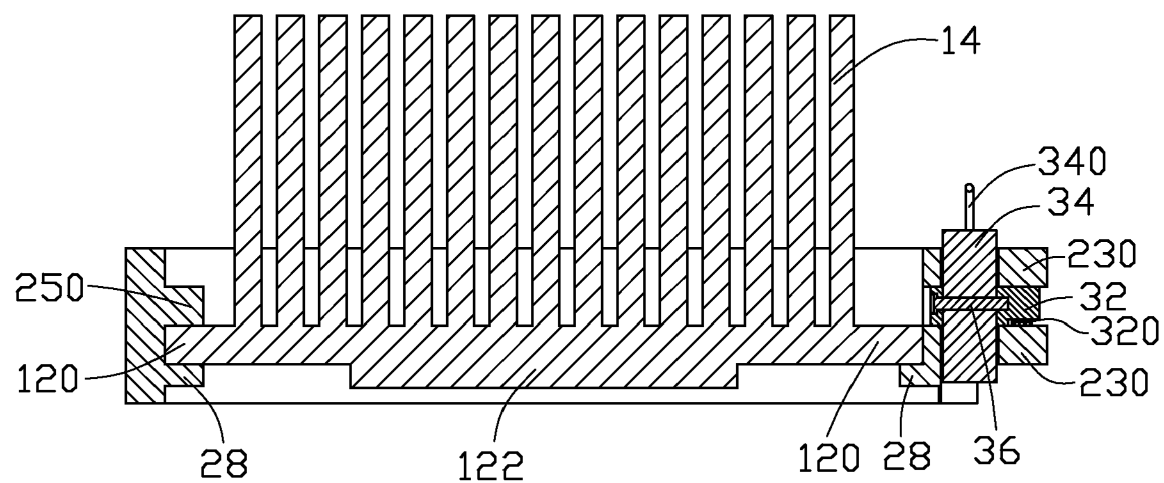
FIG. 4 is a cross-sectional view of the heat dissipation device taken along line IV-IV of FIG. 3.
Figure 5:
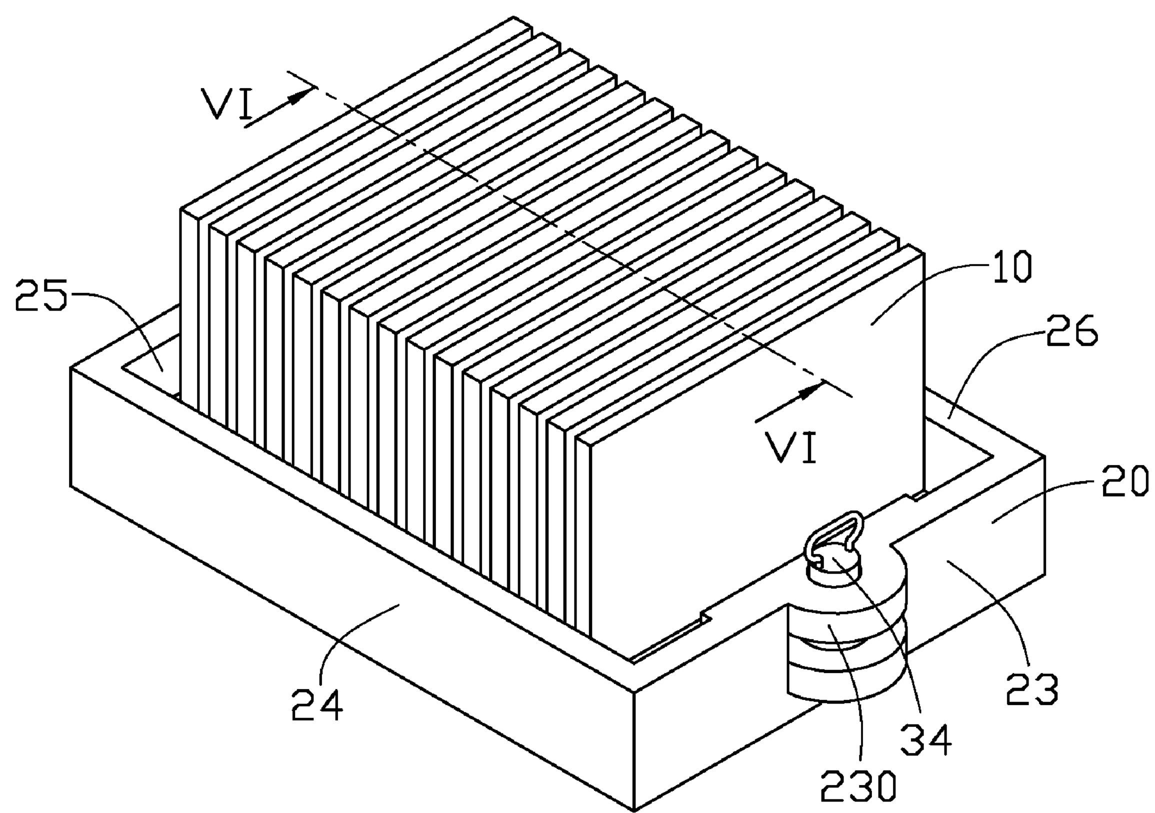
FIG. 5 is an assembled view of FIG. 1 with the rotatable fastener at a locked position.
Figure 6:
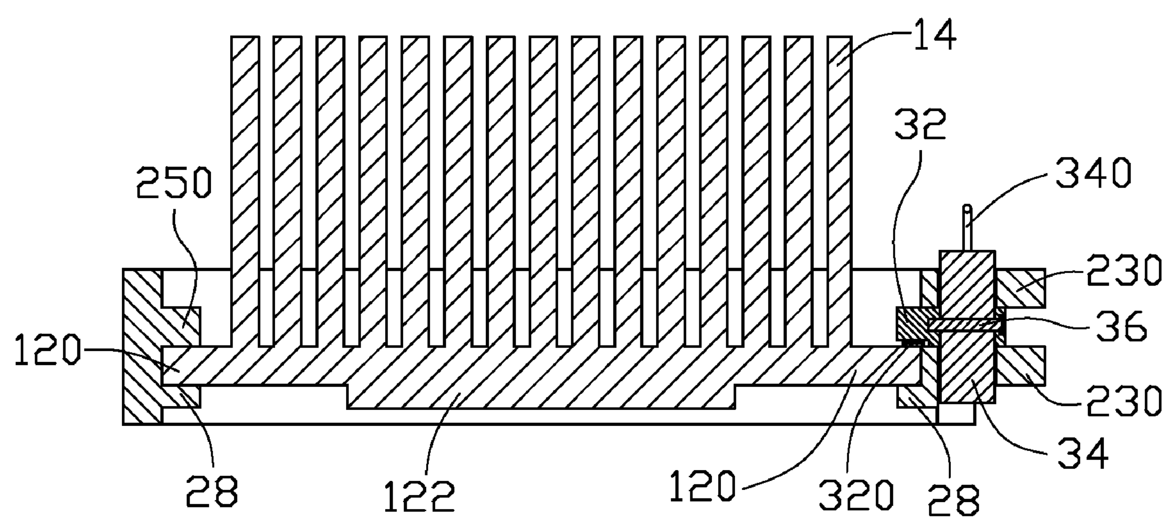
FIG. 6 is a cross-sectional view of the heat dissipation device taken along line VI-VI of FIG. 5.

In assembly, referring to FIGS. 3-4, firstly one of the border portions 120 of the base 12 of the heat sink 10 is inserted between the positioning block 250 and the supporting rib 28 of the third sidewall 25 of the retention module 20, wherein the positioning block 250 exerts a downward pressing force on the border portion 120 of the base 12 to render the border portion 120 tightly abut against the supporting rib 28 of the third sidewall 25 of the retention module 20. At this stage, the rotatable fastener 30 is at an unlocked position. The pressing portion 32 of the rotatable fastener 30 is placed between the two pivot tabs 230 and the spring 320 abuts a top surface of a lower one of the pivot tabs 230 (shown in FIG. 4). Referring to FIGS. 5-6, by rotating the actuating portion 34 of the rotatable fastener 30 by operating the handle 340, the pressing portion 32 is moved to pass through the mouth 234 of the first sidewall 23 and press downwards the other border portion 120 of the base 12 towards the supporting rib 28 of the first sidewall 23 of the retention module 20. At this position, the spring 320 is brought to downwardly press the other border 120 of the base 12 of the heat sink 10 towards the supporting rib 28 of the first sidewall 23 of the retention module 20. The other border portion 120 of the base 12 is thus tightly sandwiched between the pressing portion 32 and the supporting rib 28 of the first sidewall 23 due to action of spring force produced by the spring 320 of the pressing portion 32, whereby the other border portion 120 is urged toward the supporting rib 28 of the first sidewall 23 of the retention module 20. Therefore, two opposite end portions of the base 12 of the heat sink 10 are pressed by the positioning block 250 and the pressing portion 32 of the rotatable fastener 30 to tightly abut against the supporting ribs 28 of the retention module 20, whereby the heat sink 10 is securely retained in the retention module 20.

According to the above embodiment of the present invention, the positioning block 250 of the retention module 20 and the pressing portion 32 of the rotatable fastener 30 have a large contacting surface with the two end portions of the base 12 of the heat sink 10. Therefore, the heat sink 10 is more firmly secured in the retention module 20 via the positioning block 250 and the pressing portion 32 pressing on the base 12 of the heat sink 10, in comparison with a linear-type locking device generally with a slender structure. The rotatable fastener 30 is rotatably connected to the retention module 20, such that when the rotatable fastener 30 is at the unlocked position, the pressing portion 32 of the rotatable fastener 30 is rotated to the position between the pivot tabs 230, whereby the heat sink 10 is removable from the retention module 20. When at the locked position, the positioning block 250 and the pressing portion 32 downwardly press the base 12 of the heat sink 10 on the supporting ribs 28 of the retention module 20. So, it is expedient to secure the heat sink 10 in the retention module 20 and attach the heat sink 10 to the CPU.

For removal of the heat sink 10 from the retention module 20, by rotating the actuating portion 34 of the rotatable fastener 30, the pressing portion 32 is moved to disengage from the other border 120 of the base 12 of the heat sink 10. Here, the pressing force of the pressing portion 32 acting on the other border 120 of the base 12 of the heat sink 10 is released, and the heat sink 10 is removed from the retention module 20 with the left border 120 as viewed from the drawings being drawn out from the retention module 20. Thus, the disassembly of the heat sink 10 from the retention module 20 is also expedient.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:

a heat sink comprising a base adapted for contacting a heat-generating component;

a retention module adapted for being located around the heat-generating component, the retention module comprising a pair of supporting portions at two opposite sidewalls thereof and a positioning block being positioned above one of the supporting portions; and a rotatable fastener rotatably connected to the retention module at a position opposite the positioning block and having a pressing portion being movable relative to the retention module between unlocked and locked positions;

wherein at the locked position the base of the heat sink rests on the supporting portions of the retention module with an end portion of the heat sink being pressed by the positioning block and an opposite end portion of the heat sink being pressed by the pressing portion of the rotatable fastener, and at the unlocked position, the rotatable fastener is rotated to a position wherein the pressing portion is moved away from the opposite end portion of the heat sink;

wherein the rotatable fastener comprises an actuating portion extending in the pressing portion and securely connected therewith and the retention module forms at least one pivot tab with at least one pivot hole defined therein, and wherein the actuating portion is rotatably received in the at least one pivot hole; and wherein the rotatable fastener comprises a bolt inserted in the pressing portion and the actuating portion to fasten the pressing portion to the actuating portion.

2. The heat dissipation device as claimed in claim 1, wherein the retention module comprises a pair of pivot tabs extending outwardly and the pressing portion of the rotatable fastener is located between the two pivot tabs when the pressing portion is moved to the unlocked position.

3. The heat dissipation device as claimed in claim 2, wherein the retention module defines a mouth opposite the positioning block, the pressing portion of the rotatable fastener passing through the mouth to press on the base of the heat sink when the rotatable fastener is moved from the unlocked position to the locked position.

4. The heat dissipation device as claimed in claim 3, wherein the pressing portion of the rotatable fastener comprises a spring exerting a downwardly pressing force on the base of the heat sink when the pressing portion is at the locked position.

5. The heat dissipation device as claimed in claim 3, wherein the actuating portion of the rotatable fastener has a handle at an upper end portion thereof, for facilitating exertion of a rotation force to the rotatable fastener.

6. The heat dissipation device as claimed in claim 1, wherein the base of the heat sink has two border portions at two opposite sides thereof respectively, one border portion being sandwiched between the positioning block and one of the supporting portions of the retention module, and the other border portion being pressed by the pressing portion of the rotatable fastener to abut against the other supporting portion of the retention module when the rotatable fastener is at the locked position.

7. The heat dissipation device as claimed in claim 6, wherein the base of the heat sink comprises a protruding portion extending downwardly from a bottom thereof, adapted for contacting the heat-generating component.

8. A heat dissipation device adapted for dissipating heat generated by an electronic device mounted on a printed circuit board, comprising:

a retention module adapted for mounting on the printed circuit board and surrounding the electronic device, the retention module comprising a positioning block disposed at one side thereof;

a heat sink adapted for contacting with the electronic device, being mounted on the retention module and having a portion pressed by the positioning block to abut against a bottom wall of the retention module; and a rotatable fastener having an actuating portion rotatably received in the retention module and a pressing portion fastened to the actuating portion and exerting a pressing force on an opposite portion of the heat sink towards the bottom wall of the retention module when the rotatable fastener is rotated from an unlocked position to a locked position;

wherein the retention module comprises a pair of pivot tabs extending outwardly from a side edge of thereof, the actuating portion being rotatably extended in the pivot tabs and the pressing portion being located between the two pivot tabs when the rotatable fastener is at the unlocked position; and wherein the rotatable fastener comprises a bolt extending in the pressing portion and the actuating portion to fasten the pressing portion and the actuating portion together.

9. The heat dissipation device as claimed in claim 8, wherein the retention module defines a mouth in a sidewall thereof corresponding to the pressing portion of the rotatable fastener, the mouth being provided for the pressing portion to extend therethrough when the rotator is moved from the unlocked position to the locked position.

10. The heat dissipation device as claimed in claim 8, wherein the pressing portion defines a retaining hole therein and the actuating portion is received in the retaining hole.

* * * * *